United States Patent
Tanida et al.

(10) Patent No.: US 7,521,790 B2
(45) Date of Patent: Apr. 21, 2009

(54) SEMICONDUCTOR DEVICE MODULE AND MANUFACTURING METHOD OF SEMICONDUCTOR DEVICE MODULE

(75) Inventors: Yoshinori Tanida, Nara (JP); Kazuya Fujita, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 386 days.

(21) Appl. No.: 11/388,712

(22) Filed: Mar. 23, 2006

(65) Prior Publication Data
US 2006/0220232 A1 Oct. 5, 2006

(30) Foreign Application Priority Data
Mar. 29, 2005 (JP) .............. 2005-095572

(51) Int. Cl.
*H01L 23/12* (2006.01)
(52) U.S. Cl. ............ 257/704; 438/26; 438/27; 438/116
(58) Field of Classification Search .......... 257/704; 438/26, 27, 116
See application file for complete search history.

(56) References Cited

U.S. PATENT DOCUMENTS

| 6,767,753 | B2 * | 7/2004 | Huang ............... 438/25 |
| 6,953,891 | B2 * | 10/2005 | Bolken et al. ......... 174/559 |
| 2002/0140072 | A1 | 10/2002 | Chiu |
| 2004/0159954 | A1 * | 8/2004 | Hetzel et al. .......... 257/777 |
| 2004/0256687 | A1 | 12/2004 | Omori |
| 2005/0275050 | A1 * | 12/2005 | Tsai et al. ............ 257/433 |

FOREIGN PATENT DOCUMENTS

| JP | 61-289772 | 12/1986 |
| JP | 6-21414 | 1/1994 |
| JP | 2004-072572 | 3/2004 |

* cited by examiner

*Primary Examiner*—Trung Dang
(74) *Attorney, Agent, or Firm*—Edwards Angell Palmer & Dodge LLP; David G. Conlin; Peter J. Manus

(57) ABSTRACT

In a module for an optical device as a semiconductor device module of the present invention, a bonding wire that electrically connects a substrate on which a conductor wiring is formed and an image pickup element as a semiconductor element is covered with a cover, and a holder as a lid is placed over the cover.

15 Claims, 11 Drawing Sheets

SEMICONDUCTOR DEVICE MODULE AND MANUFACTURING METHOD OF SEMICONDUCTOR DEVICE MODULE

CROSS-REFERENCE TO RELATED APPLICATION

This non-provisional application claims priority under 35 U.S.C. §119(a) on Patent Application No. 2005-95572 filed in Japan on Mar. 29, 2005, the entire contents of which are hereby incorporated by reference.

BACKGROUND OF THE INVENTION

1. Field of the Invention

The present invention relates to a semiconductor device module comprising a semiconductor element placed on a substrate, and a lid placed to face the semiconductor element and cover the semiconductor element, and relates to a manufacturing method of the semiconductor device module.

2. Description of Related Art

Image pickup elements, such as a CCD or a CMOS imager as a kind of semiconductor element, are used in various fields. In particular, mobile phones with camera having a camera function in addition to a communication function by the incorporation of an image pickup element are widely used in practical applications. With a reduction in the size, thickness and weight of products such as mobile phones with camera and digital cameras, a module for an optical device that is one embodiment of a semiconductor device module comprising an image pickup element and a lens as a module has been put into practical use (see, for example, Japanese Patent Application Laid Open No. 2004-72572).

FIG. 1 is a sectional side view showing the structure of a conventional module for an optical device as one embodiment of a semiconductor device module, and FIG. 2 is a sectional plan view of the lower side from the XI-XI line of FIG. 1.

In a conventional module 100 for an optical device, an image pickup element 111 is placed on a substrate 110, and a bonding pad 111*b* provided on the peripheral edge of the image pickup element 111 and a bonding pad 110*b* provided on the peripheral edge of the substrate 110 are electrically connected with a bonding wire 113. Moreover, a cylindrical holder 120 is joined with an adhesive 140 outside the bonding pads 110*b*. Placed in the holder 120 is an IR cut filter 121 for cutting infrared (IR) in light striking the image pickup element 111. Further, a lens barrel 130 is placed inside the holder 120. A lens 131 is placed in the lens barrel 130, and its position with respect to the image pickup element 111 is adjusted so as to focus external light on a light receiving section 111*a* located at the center of the image pickup element 111.

BRIEF SUMMARY OF THE INVENTION

In the conventional module 100 for an optical device, however, the leg part of the holder 120 needs to be placed outside the position of the bonding wire 113 connected to the substrate 110, and therefore the external size of the substrate 110 must be made larger by an extra amount corresponding to the thickness of the holder 120. In other words, in the conventional structure, an area for placing the leg part of the holder 120 must be ensured in addition to the external size necessary to function as an image pickup element (a line connecting the outside edges of the bonding pads 110*b* as the connection section for the bonding wire 113 to the substrate 110 (an alternate long and short dash line in FIG. 2)), and consequently it is necessary to increase the plane size of the module 100 for an optical device by an amount corresponding to the area. This area is only necessary for placing the holder 120 as a holder body for an optical path demarcating device, and is a useless area that has no influence on the image pickup function.

By the way, in recent years, there is a demand for a smaller and lighter module for an optical device for use in a mobile phone with camera, a digital camera, etc. Reducing the size of the substrate 110 also has considerable merit from the point of view of manufacturing costs, and therefore there has been a demand for the development of a new structure as a fundamental structure of a module for an optical device.

The present invention has been made with the aim of solving the above problem, and it is an object of the present invention to provide a semiconductor device module that enables a further reduction in the external size (plane size) and can prevent detachment of an electrically conductive wire even when an external shock occurs by covering the electrically conductive wire, which electrically connects a semiconductor element and a substrate on which a conductor wiring is formed, with a cover and placing a lid facing the semiconductor element over the cover.

It is another object of the present invention to provide a semiconductor device module capable of preventing entry of moisture, dust, etc. from outside and improving the durability of the semiconductor element by sealing the semiconductor element with the substrate, lid and cover.

It is an object of the present invention to provide a semiconductor device module with a structure in which the substrate and the lid are connected at a position where a bonding pad for connecting an electrically conductive wire connecting electrically to the semiconductor element is not placed, so that it becomes possible to improve the bonding performance by ensuring a position for directly connecting the lid to the substrate and avoid an increase in the external size (plane size) by appropriately ensuring a position where no bonding pad is placed as a bonding section.

A further object of the present invention is to provide a semiconductor device module with a structure in which the substrate has a rectangular shape and the bonding pads are placed one to three sides of the substrate, so that it becomes possible to improve the bonding performance by providing a bonding section for bonding the lid on a side edge of the substrate where no bonding pad is placed and reduce the external size (plane size) without separately ensuring an area for placing the lid on the substrate outside the side edge where the bonding pad is placed.

It is a further object of the present invention to provide a semiconductor device module with a structure in which the thickness of a bonding section provided on the substrate is greater than other section, so that it becomes possible to improve the bonding performance by directly connecting the substrate and the lid at this section, and easily cover the electrically conductive wire with a cover since the electrically conductive wire is exposed in a gap created by placing the lid.

It is a further object of the present invention to provide a semiconductor device module with a structure in which a lid having a leg part in an area corresponding to the bonding section is placed so that the leg part and the substrate are bonded together if the substrate is in the form of a flat plate, so that it becomes possible to improve the bonding performance by directly connecting the substrate and the lid, and easily cover the electrically conductive wire with a cover since the electrically conductive wire is exposed in a gap crated by bonding the leg part to the substrate.

It is a further object of the present invention to provide a semiconductor device module with a structure in which the electrically conductive wire connecting electrically the substrate on which the conductor wiring is formed and the semiconductor element is covered with a non-electrically conductive resin, so that it becomes possible to easily form the cover in a manufacturing step.

It is a further object of the present invention to provide a module for an optical device (image pickup module) as one embodiment of a semiconductor device module in a small external size (plane size) by comprising an image pickup element having an image pickup surface on one surface as a semiconductor element, and a lid part having an optical member and a holder body for holding the optical member, and demarcating an optical path to the image pickup surface of the image pickup element.

It is a further object of the present invention to provide a manufacturing method of a semiconductor device module, capable of easily and surely manufacturing a semiconductor device module in a small external size (plane size) by electrically connecting a substrate on which a conductor wiring is formed and a semiconductor element with an electrically conductive wire, placing the leg part of a lid on the substrate and bonding the lid to the substrate, covering a part or all of the electrically conductive wire with a cover to seal the gap between the substrate and the lid and cover the electrically conductive wire with the cover, and placing the lid over the cover.

It is a further object of the present invention to provide a manufacturing method of a semiconductor device module, capable of very easily forming the cover by injecting a non-electrically conductive resin into the gap created by placing the leg part of the lid on the substrate to cover the electrically conductive wire exposed in the gap.

It is a further object of the present invention to provide a manufacturing method of a semiconductor device module, capable of easily and surely manufacturing a semiconductor device module in a small external size (plane size) by electrically connecting the substrate on which the conductor wiring is formed and the semiconductor element with the electrically conductive wire, covering a part or all of the electrically conductive wire with a cover, and placing the lid on the cover to fix the position of the lid with respect to the substrate, without the need of separately ensuring an area for placing the lid on the substrate since the lid is placed on the cover after covering the electrically conductive wire with the cover.

It is a further object of the present invention to provide a manufacturing method of a semiconductor device module, capable of very easily forming the cover by making the cover for covering the electrically conductive wire by applying a non-electrically conductive resin with a curing property to a corresponding position of the electrically conductive wire and then curing the applied non-electrically conductive resin.

It is a further object of the present invention to provide a manufacturing method of a semiconductor device module, capable of easily forming the cover for covering the electrically conductive wire by using a non-electrically conductive resin with a heat-curing property or a photo-curing property and giving heat energy if the non-electrically conductive resin has a heat-curing property, or light energy if it has a photo-curing property, to control the curing of the non-electrically conductive resin.

It is a further object of the present invention to provide a manufacturing method of a semiconductor device module, capable of easily forming the cover for covering the electrically conductive wire by using a non-electrically conductive resin with a heat-curing property or a photo-curing property, placing the lid on the cover before the non-electrically conductive resin cures, and giving heat energy if the non-electrically conductive resin has a heat-curing property, or light energy if it has a photo-curing property, to control the curing of the non-electrically conductive resin, and capable of appropriately adjusting the position of placing the lid by placing the lid before the non-electrically conductive resin cures when the position of the lid with respect to the substrate is fixed by placing the lid on the cover.

A semiconductor device module according to the present invention is a semiconductor device module comprising: a substrate on which a conductor wiring is formed; a semiconductor element connected to the conductor wiring with an electrically conductive wire; and a lid placed to face the semiconductor element, and characterized by comprising a cover for covering a part or all of the electrically conductive wire, wherein the lid is placed over the cover.

In this invention, the electrically conductive wire that electrically connects the substrate on which the conductor wiring is formed and the semiconductor element is covered with the cover, and the lid facing the semiconductor element is placed over the cover. Thus, since it is not necessary to separately ensure an area for placing the lid on the substrate, it is possible to further reduce the external size (plane size). In short, it is not necessary to provide a useless area that has no influence on the function of the semiconductor element. Moreover, since the electrically conductive wire is covered with the cover, it is possible to prevent detachment of the electrically conductive wire due to external forces, and improve the shock resistance.

The semiconductor device module according to the present invention is characterized in that the semiconductor element is sealed with the substrate, the lid and the cover.

In this invention, the semiconductor element is sealed with the substrate, the lid and the cover. Consequently, since the space produced by the substrate, lid and cover is a sealed space, it is possible to prevent entry of moisture, dust, etc. from outside, and improve the durability. For example, in the case where the semiconductor element is an image pickup element, if dust adheres to the light receiving section of the image pickup element, noise may appear in a captured image. However, this problem can be solved by making the space a sealed space. Further, since the substrate, lid and cover are fixed to each other, the total shock resistance of the module is improved.

The semiconductor device module according to the present invention is characterized in that the substrate has a bonding pad for connecting the electrically conductive wire, and a bonding section for bonding the lid at a position where the bonding pad is not provided.

In this invention, the substrate and the lid are connected at a position where the bonding pad for connecting the electrically conductive wire connecting electrically to the semiconductor element is not placed. In this case, by ensuring a position for directly connecting the lid to the substrate, it is possible to improve the bonding performance. By appropriately ensuring a position where the bonding pad is not provided for a bonding section, it is possible to avoid an increase in the external size (plane size).

The semiconductor device module according to the present invention is characterized in that the substrate has a rectangular shape, and the bonding pads are placed on one to three sides of the substrate.

In this invention, the substrate has a rectangular shape, and the bonding pads are placed on one to three sides of the substrate. In this case, by providing a bonding section for bonding the lid on a side edge of the substrate where the bonding pad is not provided, it is possible to improve the bonding performance. On the side edge where the bonding pad is placed, since the electrically conductive wire is covered with the cover and the lid is placed over the cover, it is not necessary to separately ensure an area for placing the lid on the substrate outside the side edge where the bonding pad is placed, thereby enabling a further reduction in the external size (plane size).

The semiconductor device module according to the present invention is characterized in that the substrate has a greater thickness in the bonding section than in other section, and the lid is bonded to the substrate in an area where the substrate has the greater thickness.

In this invention, the thickness of the bonding section of the substrate is made greater than that of other section, and the substrate and the lid are bonded at this section. Thus, the lid is placed on the substrate having a wall (protruding section) at a position (here, the bonding section) where the bonding pad for connecting the electrically conductive wire is not placed. The electrically conductive wire is exposed in a gap created by placing the lid, and therefore the electrically conductive wire is covered with the cover.

The semiconductor device module according to the present invention is characterized in that the substrate is in the form of a flat plate, and the lid has a leg part in an area corresponding to the bonding section and is bonded to the substrate by the leg part.

In this invention, if the substrate is in the form of a flat plate, the lid having a leg part in an area corresponding to the bonding section is placed so that the leg part and the substrate are bonded together. The electrically conductive wire is exposed in a gap created by bonding the leg part of the lid to the substrate, and therefore the electrically conductive wire is covered with the cover.

The semiconductor device module according to the present invention is characterized in that the cover is made of a non-electrically conductive resin.

In this invention, the electrically conductive wire that electrically connects the substrate on which the conductive wiring is formed and the semiconductor element is covered with the non-electrically conductive resin. If the cover for covering the electrically conductive wire is a non-electrically conductive resin, it is possible to easily form the cover in a manufacturing step. For example, it is possible to very easily form the electrically conductive wire exposed in the gap by first placing the lid on the substrate and then injecting the non-electrically conductive resin into the created gap.

The semiconductor device module according to the present invention is characterized in that the semiconductor element is an image pickup element having an image pickup surface on one surface, and the lid has an optical member and a holder body for holding the optical member, and demarcates an optical path to the image pickup surface.

In this invention, the semiconductor element is an image pickup element having an image pickup surface on one surface, and the lid has an optical member and a holder body for holding the optical member, and demarcates an optical path to the image pickup surface of the image pickup element, thereby realizing a module for an optical device (image pickup module) as one embodiment of a semiconductor device module in a small external size (plane size). For example, in the case where the semiconductor element is an image pickup element, if dust adheres to the light receiving section of the image pickup element, noise may appear in a captured image. However, this problem can be solved by making the space a sealed space. In particular, this module is suitable for portable electronic apparatuses, such as a mobile phone with camera and a digital camera, that are required to have small size and shock resistance.

A manufacturing method of a semiconductor device module according to the present invention is a manufacturing method of a semiconductor device module comprising a substrate on which a conductor wiring is formed, a semiconductor element connected to the conductor wiring with an electrically conductive wire, and a lid with a leg part placed to face the semiconductor element, and characterized by comprising: a step of placing the semiconductor element on the substrate and connecting the semiconductor element and the substrate with the electrically conductive wire; a bonding step of placing the leg part on the substrate and bonding the lid to the substrate; and a sealing step of sealing a gap between the substrate and the lid by covering a part or all of the electrically conductive wire with a cover.

In this invention, the substrate on which the conductor wiring is formed and the semiconductor element are electrically connected with an electrically conductive wire, and the lid is bonded to the substrate by placing the leg part of the lid on the substrate. Then, a part or all of the electrically conductive wire is covered with the cover to seal the gap between the substrate and the lid. For example, the lid is bonded to the substrate by placing the leg part of the lid at a position where the bonding pad for connecting the electrically conductive wire is not placed. Since there is no need to separately ensure an area for placing the leg part of the lid on the substrate outside the side edges where the bonding pads are provided, it is possible to further reduce the external size (plane size). Moreover, since the electrically conductive wire is covered with the cover, it is possible to prevent detachment of the electrically conductive wire due to external forces, and improve the shock resistance.

The manufacturing method of a semiconductor device module according to the present invention is characterized in that, in the sealing step, the cover is formed by injecting a non-electrically conductive resin into the gap.

In this invention, by injecting a non-electrically conductive resin into the gap created by placing the leg part of the lid on the substrate, the electrically conductive wire exposed in the gap is covered. By using a non-electrically conductive resin for the cover for covering the electrically conductive wire, it is possible to easily form the cover in a manufacturing step.

A manufacturing method of a semiconductor device module according to the present invention is a manufacturing method of a semiconductor device module comprising a substrate on which a conductor wiring is formed, a semiconductor element connected to the conductor wiring with an electrically conductive wire, and a lid placed to face the semiconductor element, and characterized by comprising: a step of placing the semiconductor element on the substrate and connecting the semiconductor element and the substrate with the electrically conductive wire; a covering step of covering a part or all of the electrically conductive wire with a cover; and a fixing step of fixing a position of the lid with respect to the substrate by placing the lid on the cover.

In this invention, the substrate on which the conductor wiring is formed and the semiconductor element are electrically connected with the electrically conductive wire, and a part or all of the electrically conductive wire is covered with the cover. Then, the position of the lid with respect the substrate is fixed by placing the lid on the cover. Thus, by placing the lid on the cover after covering the electrically conductive wire with the cover, it is not necessary to separately ensure an area for placing the lid on the substrate, thereby enabling a further reduction in the external size (plane size). In short, it is not necessary to provide a useless area that has no influence on the function of the semiconductor element. Moreover, since the electrically conductive wire is covered with the cover, it is possible to prevent detachment of the electrically conductive wire due to external forces, and improve the shock resistance.

The manufacturing method of a semiconductor device module according to the present invention is characterized in that, in the covering step, the cover is formed by applying a non-electrically conductive resin with a curing property and curing the non-electrically conductive resin.

In this invention, after applying a non-electrically conductive resin with a curing property to a corresponding position of the electrically conductive wire, the applied non-electrically conductive resin is cured to form the cover for covering the electrically conductive wire. Thus, it is possible to form the cover very easily.

The manufacturing method of a semiconductor device module according to the present invention is characterized in that the non-electrically conductive resin has a heat-curing property or a photo-curing property.

In this invention, since a non-electrically conductive resin with a heat-curing property or photo-curing property is used, it is possible to easily form the cover for covering the electrically conductive wire by giving heat energy if the non-electrically conductive resin has a heat-curing property, or light energy if it has a photo-curing property, to control the curing of the non-electrically conductive resin.

The manufacturing method of a semiconductor device module according to the present invention is characterized in that the non-electrically conductive resin has a heat-curing property or a photo-curing property, and, in the fixing step, the lid is placed before the non-electrically conductive resin cures.

In this invention, since a non-electrically conductive resin with a heat-curing property or a photo-curing property is used and the lid is placed on the cover before the non-electrically conductive resin cures, it is possible to easily form the cover for covering the electrically conductive wire by giving heat energy if the non-electrically conductive resin has a heat-curing property, or light energy if it has a photo-curing property, to control the curing of the non-electrically conductive resin. In the case where the position of the lid with respect to the substrate is fixed by placing the lid on the cover, the position of placing the lid can be appropriately adjusted by placing the lid before the non-electrically conductive resin cures. Moreover, since the space produced by the substrate, lid and cover is a sealed space, it is possible to prevent entry of moisture, dust, etc. from outside, and improve the durability.

The above and further objects and features of the invention will more fully be apparent from the following detailed description with accompanying drawings.

DETAILED DESCRIPTION OF THE INVENTION

The following description will explain in detail the present invention, based on the drawings illustrating some embodiments thereof.

Embodiment 1

Figure 1:
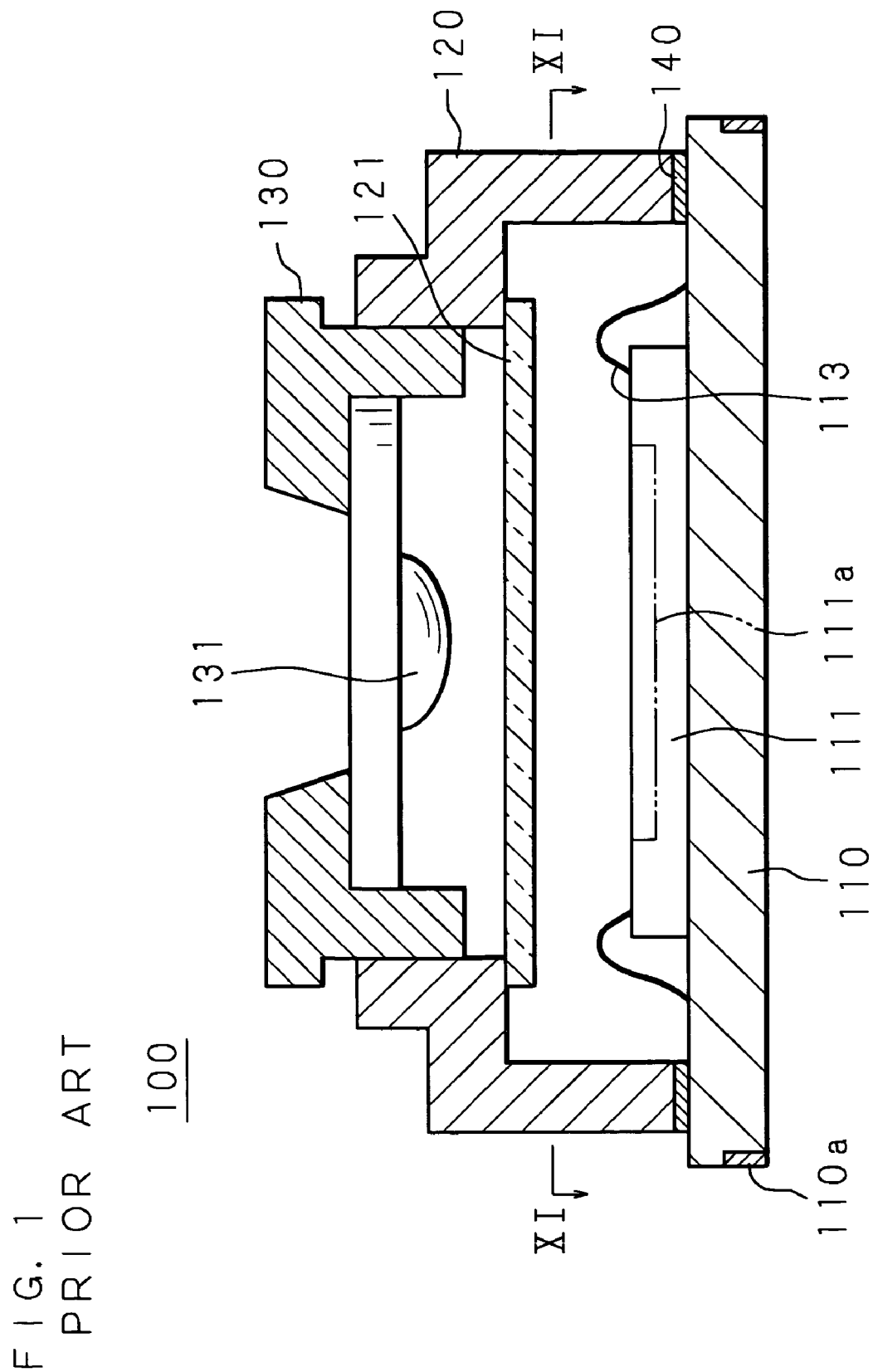
FIG. 1 is a sectional side view showing the structure of a conventional module for an optical device as one embodiment of a semiconductor device module.
Figure 2:
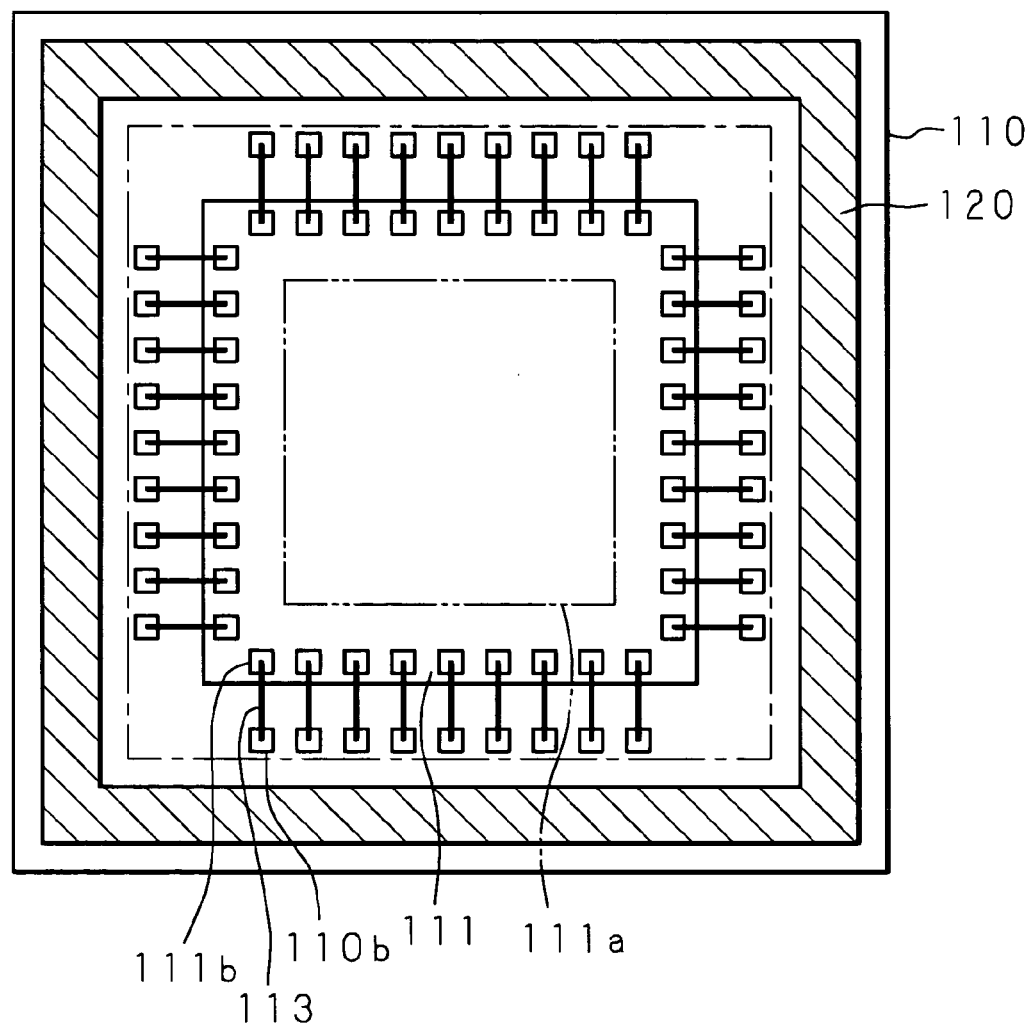
FIG. 2 is a sectional plan view of the lower side from the XI-XI line of FIG. 1.
Figure 3:
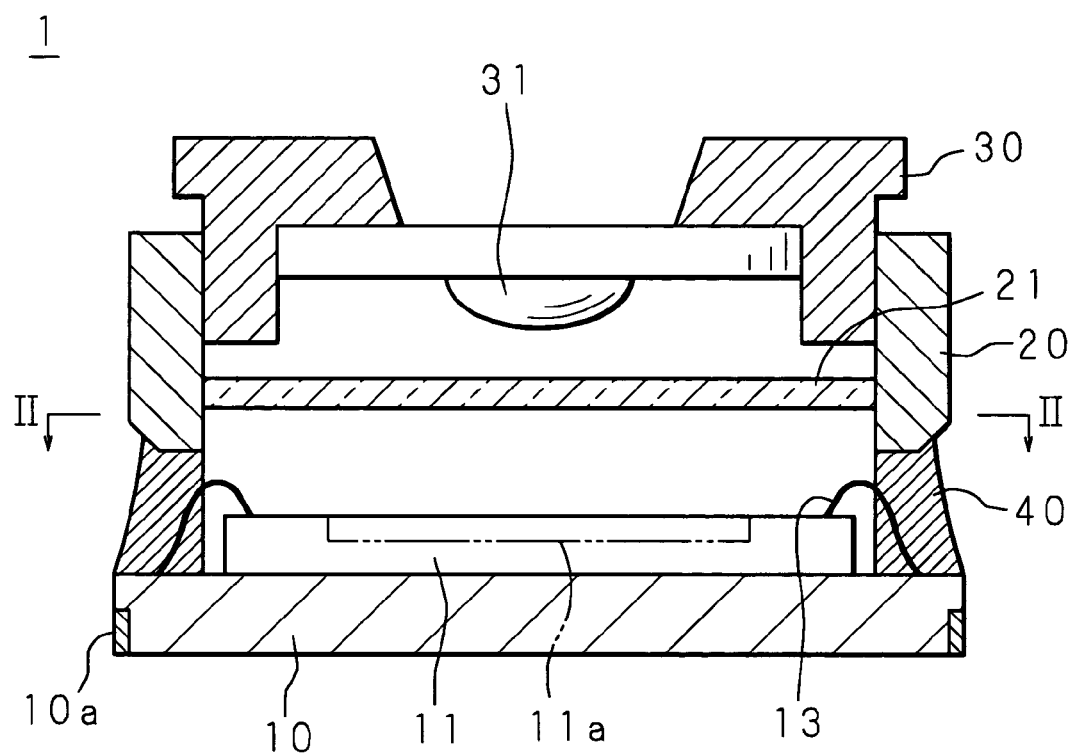
FIG. 3 is a sectional side view showing the structure of a module for an optical device as one embodiment of a semiconductor device module according to Embodiment 1 of the present invention.
Figure 4:
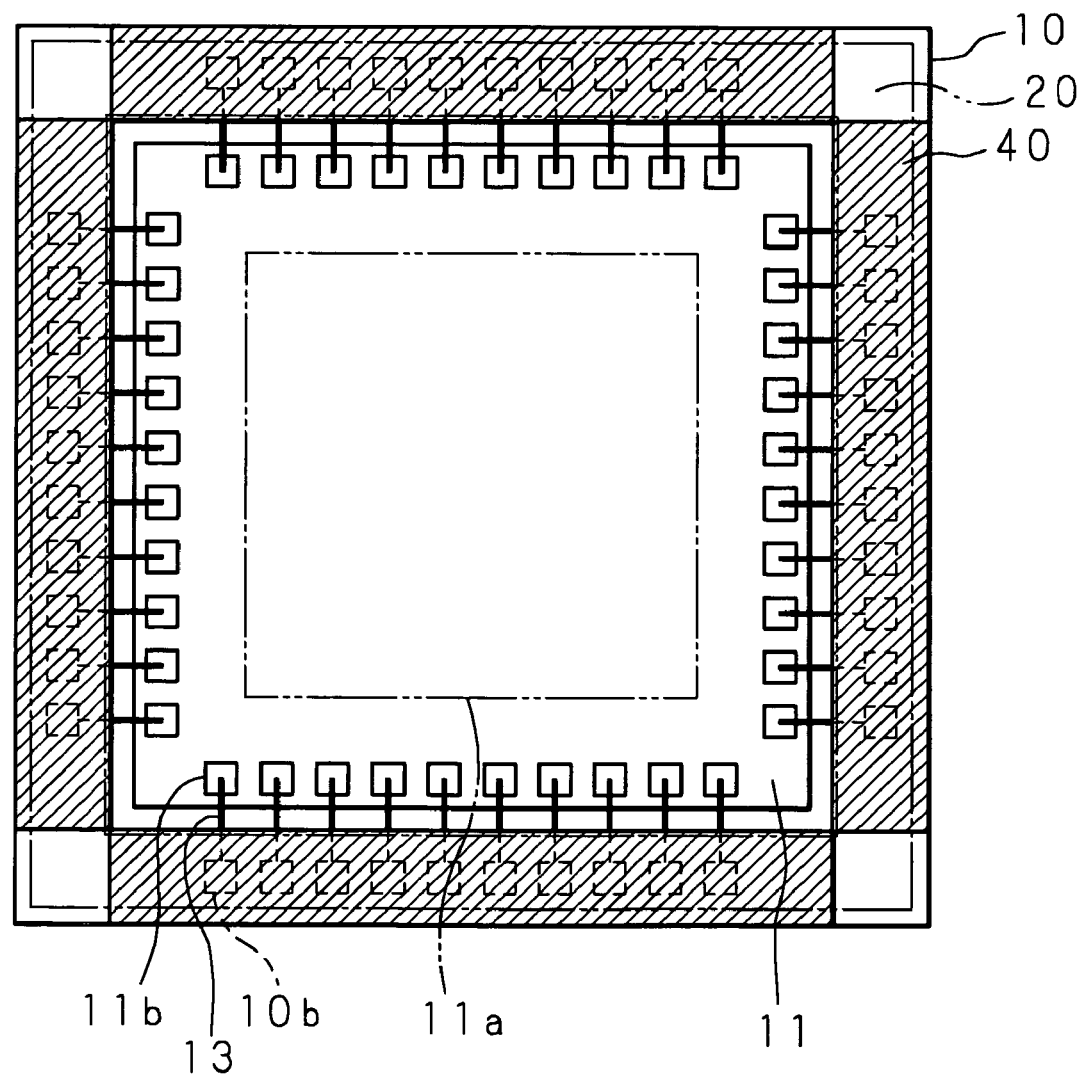
FIG. 4 is a sectional plan view of the lower side from the II-II line of FIG. 3.

FIG. 3 is a sectional side view showing the structure of a module for an optical device as one embodiment of a semiconductor device module according to Embodiment 1 of the present invention, and FIG. 4 is a sectional plan view of the lower side from the II-II line of FIG. 3.

In a module 1 for an optical device as one embodiment of a semiconductor device module according to Embodiment 1 of the present invention, an image pickup element 11 is dice bonded to one surface of a substrate 10. The image pickup element 11 is a kind of a semiconductor element such as a CCD or a CMOS imager, and comprises a light receiving section 11a at the center of a chip, and a peripheral circuit, such as a read circuit for reading a signal based on a light amount detected by the light receiving section 11a, on the periphery of the chip. Such an image pickup element 11 is manufactured by stacking a plurality of layers on a semiconductor wafer by using a known semiconductor manufacturing technique. A micro-lens may be formed on the upper surface of the light receiving section 11a to improve the light-condensed ratio to the light receiving section 11a.

The substrate 10 is a multi-layer wiring board, for example, has a predetermined wiring (not shown) on a surface thereof, and is connected to an external circuit outside the module through an external terminal 10a provided on a side face (or rear face) of the substrate 10. Moreover, a plurality of bonding pads 10b are provided on the peripheral edges of the substrate 10 (here, four sides of the chip). The bonding pad 10b is connected to a bonding pad 11b provided on the periphery of the chip of the image pickup element 11 through a bonding wire 13 (conductive wire). Thus, an electrical signal converted by the image pickup element 11 is sent from the bonding pad 11b to the bonding pad 10b through the bonding wire 13, and further sent to the external terminal 10a through the wiring formed on the substrate 10.

Moreover, a part of the bonding wire 13 (here, a part on the bonding pad 10b side) is covered with a cover 40 such as a non-electrically conductive resin, and a cylindrical holder 20 is placed over the cover 40. An IR cut filter 21 for cutting infrared (IR) in light striking the image pickup element 11 is placed in the holder 20 to face an image pickup surface. Further, a lens barrel 30 (holder body) in which a lens 31 (optical member) is placed is inserted into the holder 20. The holder 20 and lens barrel 30 work together to function as an optical path demarcating device for demarcating an optical path to the image pickup surface. They are appropriately fixed (bonded) in a state in which the optical path length from the lens 31 to the image pickup surface is adjusted and the external surface of the lens barrel 30 is in contact with the inner surface of the holder 20. Note that although this example illustrates a case where one piece of lens 31 is used, the number of lenses may vary and a plurality of pieces of lenses may be used in combination according to the need.

The space where the image pickup element 11 is placed is made a sealed space by the substrate 10, the optical path demarcating device (holder 20, lens barrel 30) as a lid of the present invention and the cover 40. It is therefore possible to prevent moisture, dust, etc. from entering into this space from outside, and improve the durability. For example, if dust adheres to the light receiving section 11a of the image pickup element 11, there is a possibility that noise may occur in a captured image. However, in the module 1 for an optical device, since the image pickup element 11 is placed in the sealed space, noise will not occur, and it is possible to capture a high-quality image. Of course, since the optical path demarcating device (holder 20, lens barrel 30) and the cover 40 are fixed to each other, the total shock resistance is improved.

Figure 5A:
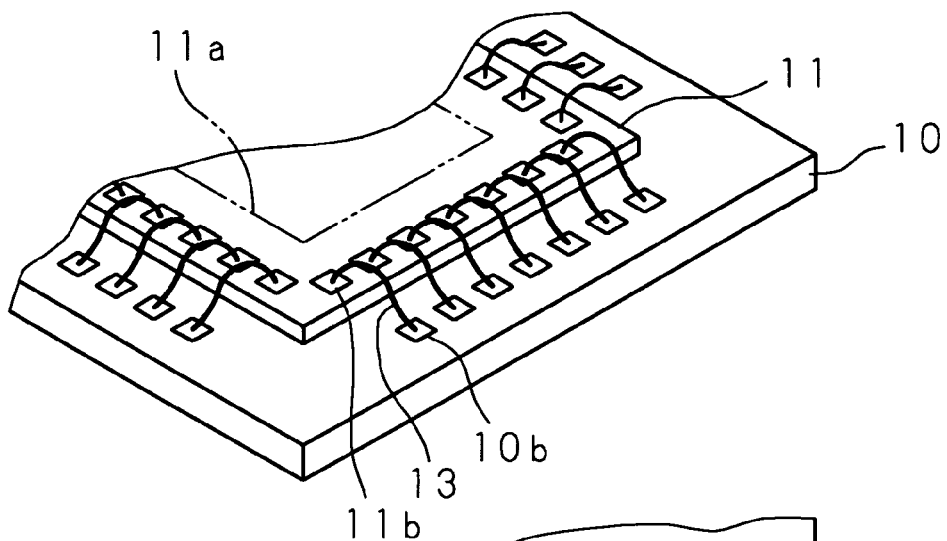
FIGS. 5A to 5C are explanatory views showing a manufacturing method of a module for an optical device as one embodiment of a semiconductor device module according to the present invention.
Figure 5B:
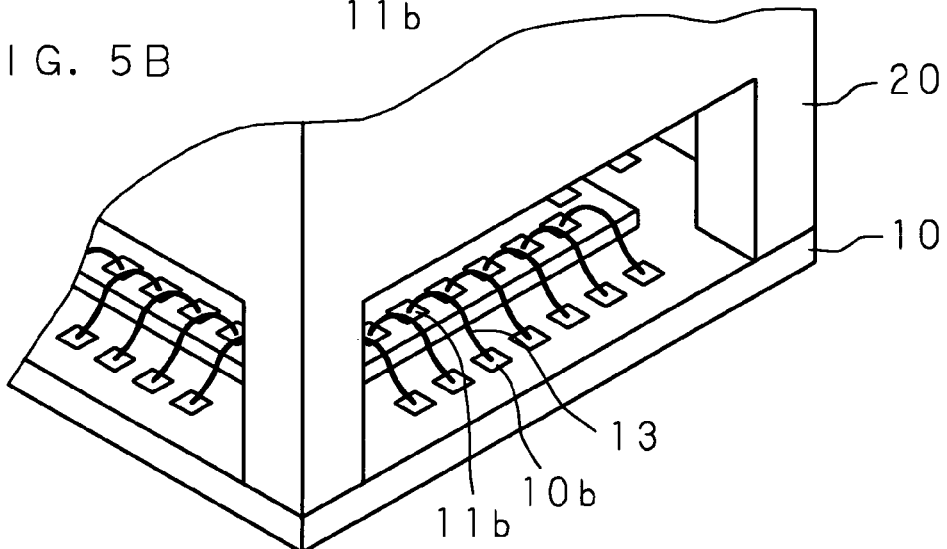
Figure 5C:
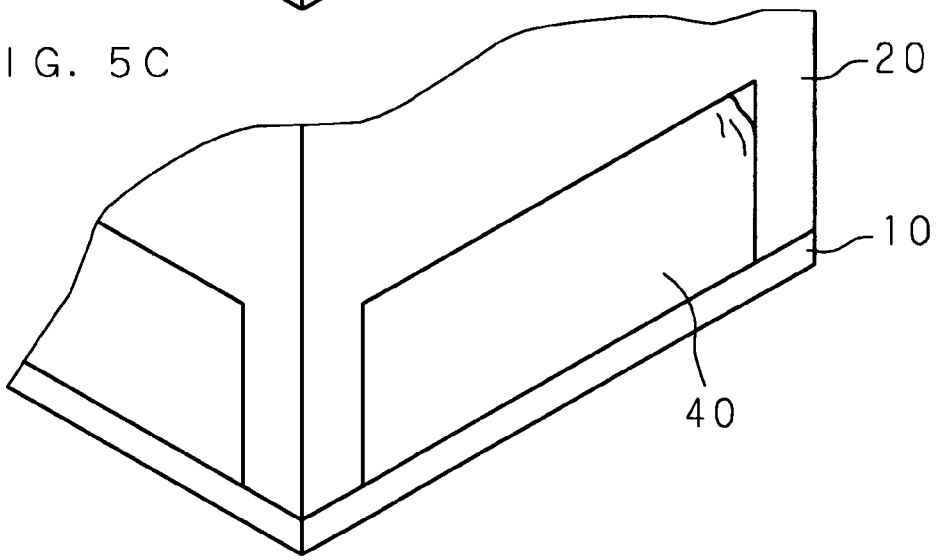

Next, the following description will explain a manufacturing method of the above-mentioned module 1 for an optical device. FIGS. 5A to 5C are explanatory views showing a manufacturing method of a module for an optical device as one embodiment of a semiconductor device module according to the present invention.

First, an image pickup element 11 having a light receiving section 11a is placed on a substrate 10 on which a conductor wiring is formed, and a bonding pad 10b provided on the substrate 10 and a bonding pad 11b provided on the image pickup element 11 are electrically connected with a bonding wire 13 (FIG. 5A).

Next, the holder 20 as a holder body for an optical path demarcating device is aligned with the substrate 10 so that the leg parts of the holder 20 are positioned on four corners of the substrate 10, and then the holder 20 is bonded to the substrate 10 by using an adhesive, etc (FIG. 5B). This example illustrates a case where the bonding pad 10b for connecting the bonding wire 13 is not provided on the four corners of the substrate, and there is no need to ensure an area for directly placing the holder 20 on the substrate 10 outside the side edges where the bonding pads 10b are provided.

Then, a cover 40 is made by injecting a non-electrically conductive resin with a heat-curing property (for example, an UV curing resin as an acryl-based resin) or a photo-curing property (for example, an epoxy-based resin) into the gap created between the substrate 10 and the holder 20 by using a dispenser, etc., and giving heat energy if the non-electrically conductive resin has a heat-curing property, or light energy if it has a photo-curing property, to control the curing of the non-electrically conductive resin and cover the bonding wire 13 exposed in the gap (FIG. 5C).

Note that the substrate 10 and the image pickup element 11 are electrically connected with the bonding wire 13, and a part or all of the bonding wire 13 is covered with the cover 40.

Then, the position of the optical path demarcating device with respect to the substrate 10 may be fixed by placing the holder 20 that is a component of the optical path demarcating device on the cover 40. In the case where the position of the optical path demarcating device with respect to the substrate 10 is fixed by placing the holder 20 on the cover 40, it is possible to avoid a situation where adjustment of the optical axis of the optical path demarcating device is infeasible by placing the holder 20 before the non-electrically conductive resin is cured.

Figure 6A:
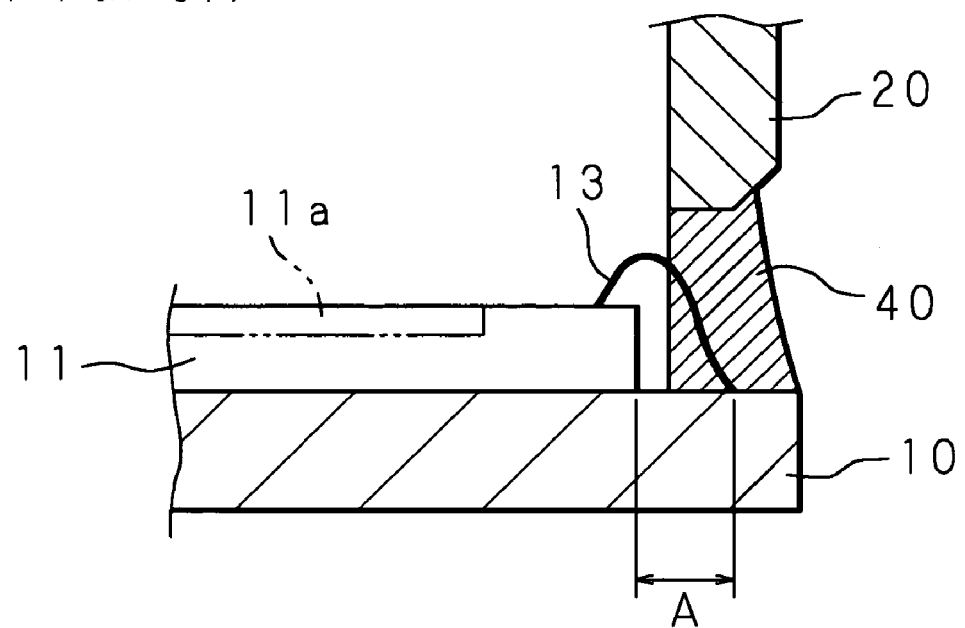
FIGS. 6A and 6B are explanatory views for explaining the external size of a module for an optical device.
Figure 6B:
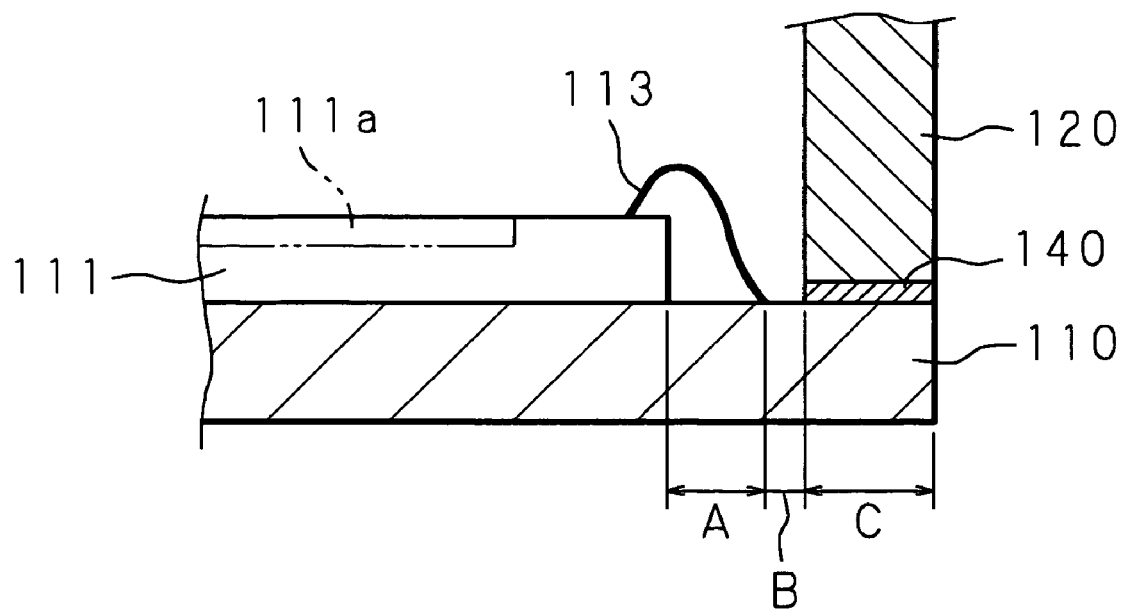

FIGS. 6A and 6B are explanatory views for explaining the external size (plane size) of a module for an optical device, and FIG. 6A and FIG. 6B show the essential parts of a module 1 for an optical device according to Embodiment 1 of the present invention and the essential parts of a conventional module 100 for an optical device, respectively.

A indicates the distance from an end of the image pickup element 11 (111) to a connection position for the bonding wire 13 (113) on the substrate 10 (110), the distance A is controlled by the wire bonding accuracy of a wire bonding device, and the size of a bonding pad to be placed on the substrate 10 (110) is determined. It is impossible to omit the distance A. B indicates the distance from the connection position for the bonding wire 113 on the substrate 110 to the inner wall of the holder 120, and the distance B is controlled by the mounting accuracy of the holder 120 with respect to the substrate 110, the wire bonding accuracy, a deviation of the pattern of the bonding pads provided on the substrate 110, etc., and is appropriately determined by taking into consideration these accuracies. C is the thickness (wall width) of the holder 120 and controlled by the material used for the holder 120, and the thickness is determined by taking into consideration the stress acting on the holder 120.

In the module 100 for an optical device, it is necessary to ensure an area corresponding to the total sum of the above-mentioned distances A, B and C from an end of the image pickup element 111. However, in the module 1 for an optical device 1, since the holder 20 is placed over the cover 40, it is not necessary to ensure an area corresponding to the distance C that is the thickness of the holder 120. The distance C is a useless area that has no influence on the image pickup function. In the present invention, since this area is not required, it is possible to make the external size (plane size) of the module 1 for an optical device smaller than the conventional one. Moreover, unlikely from the module 100 for an optical device, since the bonding wire 13 is covered with the cover 40, it is possible to prevent detachment of the bonding wire 13 due to external forces, and improve the shock resistance.

Figure 7:
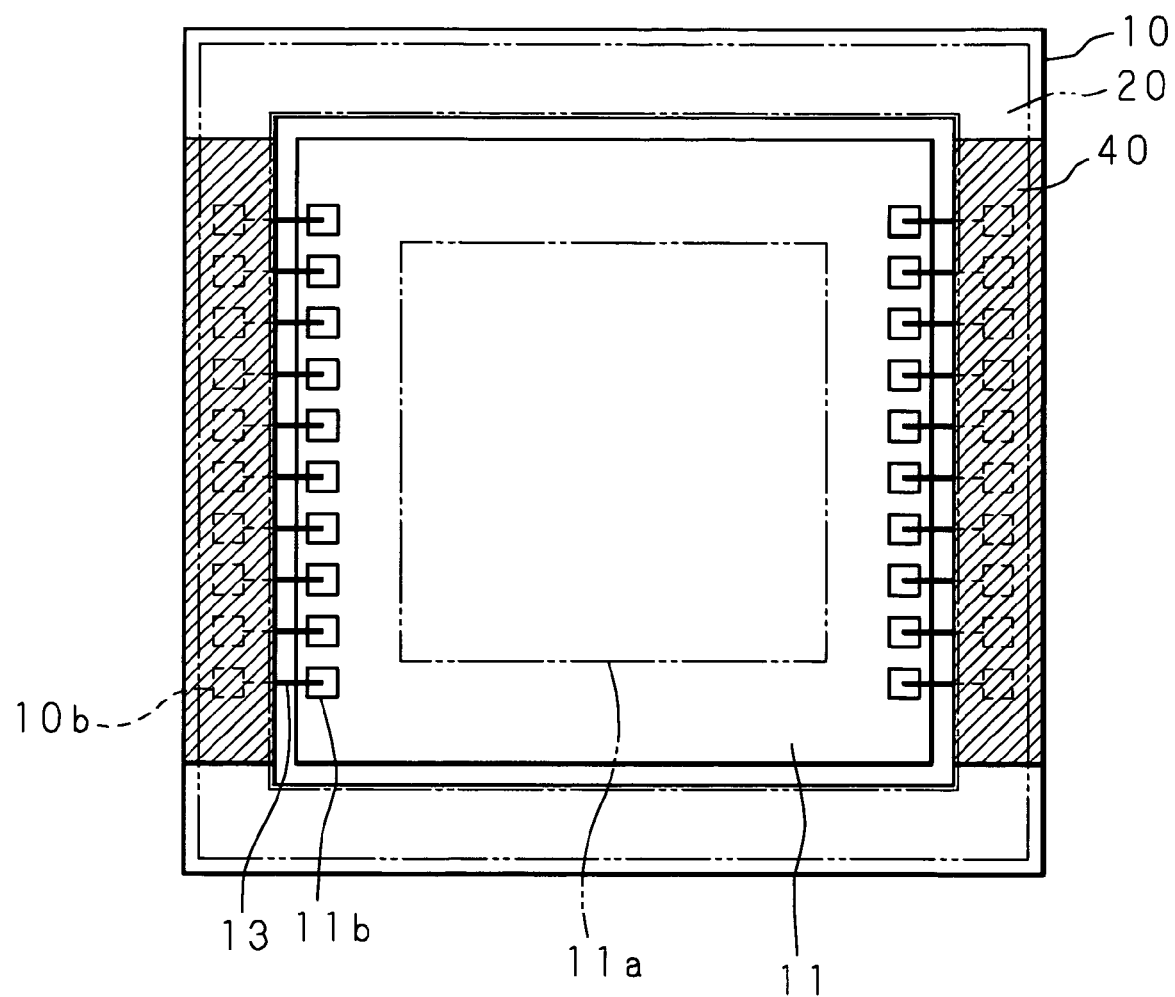
FIG. 7 is a cross sectional plan view showing another structure of a module for an optical device according to the present invention.

Note that although this embodiment illustrates the case where the bonding pads 10b are provided on the peripheral four sides of the substrate 10, it is suitable if the bonding pad is provided on at least one side of the periphery of the substrate 10. For instance, as shown in FIG. 7, if the bonding pads 10b are provided on a pair of two sides of the substrate 10, for example, two sides where the bonding pads 10b are not provided (the upper and lower sides in FIG. 7) are used as the bonding section for direct bonding, a holder 20 having a tunnel-like through portion in portions corresponding to the two sides where the bonding pads 10b are provided (the left and right sides in FIG. 7) is used, and after bonding the holder 20 to the substrate 10, the tunnel-like through portion is covered with the cover 40 to cover the bonding wires 13 placed on the left and right sides. In this case, since the bonding wires 13 are covered with the cover 40 on the side edges (left and right sides) where the bonding pads 10b are provided and the holder 20 is placed over the cover 40, there is no need to separately ensure an area for placing the holder 20 on the substrate 10 outside the side edges where the bonding pads 10b are provided, thereby enabling a reduction in the external size (plane size) compared to the conventional module.

Figure 8:
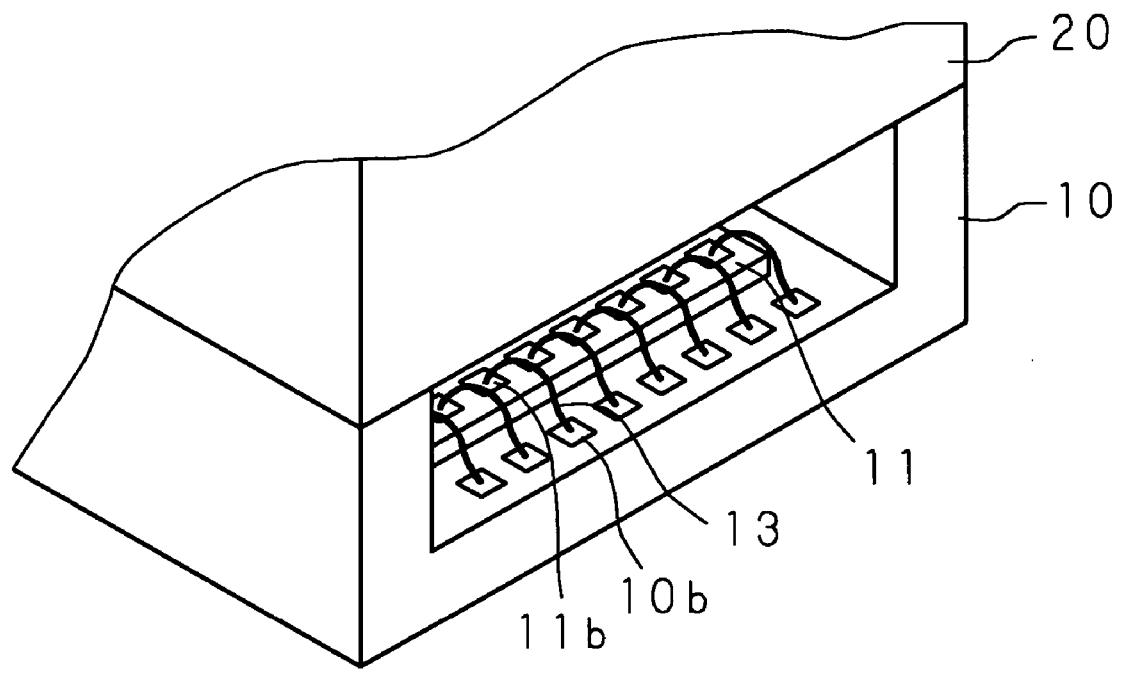
FIG. 8 is a perspective view showing another structure of a module for an optical device according to the present invention.

In this example, the substrate 10 is in the form of a flat plate and the holder 20 having leg parts in the areas corresponding to the bonding sections (the four corners of the substrate) is placed on the substrate 10 so that an area corresponding to the bonding pads 10b becomes a gap. Then, by injecting a non-electrically conductive resin into the gap, the cover 40 for covering the bonding pads 10b is formed. Alternatively, as shown in FIG. 8, it may be possible to make the thickness of the bonding section of the substrate 10 greater than that of other section and bond the substrate 10 and the holder 20 at this section. Even if a substrate 10 having a protruding section at a position (here, the bonding section) where the bonding pad 10b for connecting the bonding wire 13 is not provided is used, the bonding pads 10b are exposed in a gap created by placing the holder 20 on the substrate 10. Therefore, it is possible to produce the cover 40 for covering the bonding pads 10b by injecting a non-electrically conductive resin from this gap, and the same structure as that illustrated in this example is obtained. In FIG. 8, an illustration of the cover 40 is omitted to show the details of the structure.

Embodiment 2

Embodiment 1 explains the case where a part of the bonding wire is covered with the cover, but it may be possible to cover the entire bonding wire with the cover as shown in Embodiment 2.

Figure 9:
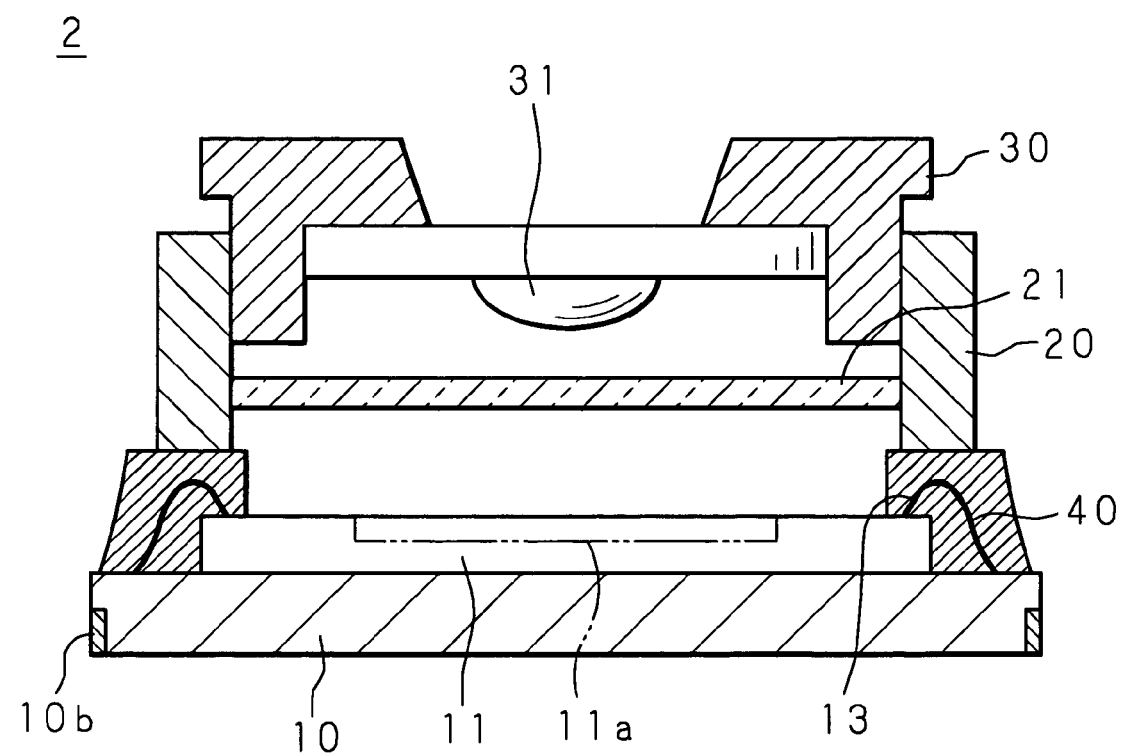
FIG. 9 is a sectional side view showing the structure of a module for an optical device as one embodiment of a semiconductor device module according to Embodiment 2 of the present invention.

FIG. 9 is a sectional side view showing the structure of a module for an optical device as one embodiment of a semiconductor device module according to Embodiment 2 of the present invention.

In a module 2 for an optical device as one embodiment of a semiconductor device module according to Embodiment 2 of the present invention, the entire bonding wire 13 is covered with a cover 40 such as a non-electrically conductive resin, and a cylindrical holder 20 is placed over the cover 40. The inside end of the cover 40 is arranged not to overlap the area of a light receiving section 11a of an image pickup element 11. This is because if the cover 40 is placed over the light receiving section 11a, noise caused by the cover 40 will appear in a captured image as a matter of course.

Thus, if the entire bonding wire 13 is covered with the cover 40, it is possible to prevent detachment of the bonding wire 13 due to external forces and it is possible to further improve the shock resistance. Moreover, since the contact area between the holder 20 and the cover 40 is increased, the total shock resistance of the module is improved. Even if the thickness of the holder 20 is further increased, it does not influence the external size (plane size), and therefore this structure is applicable to more kinds of modules for optical devices.

Figure 10A:
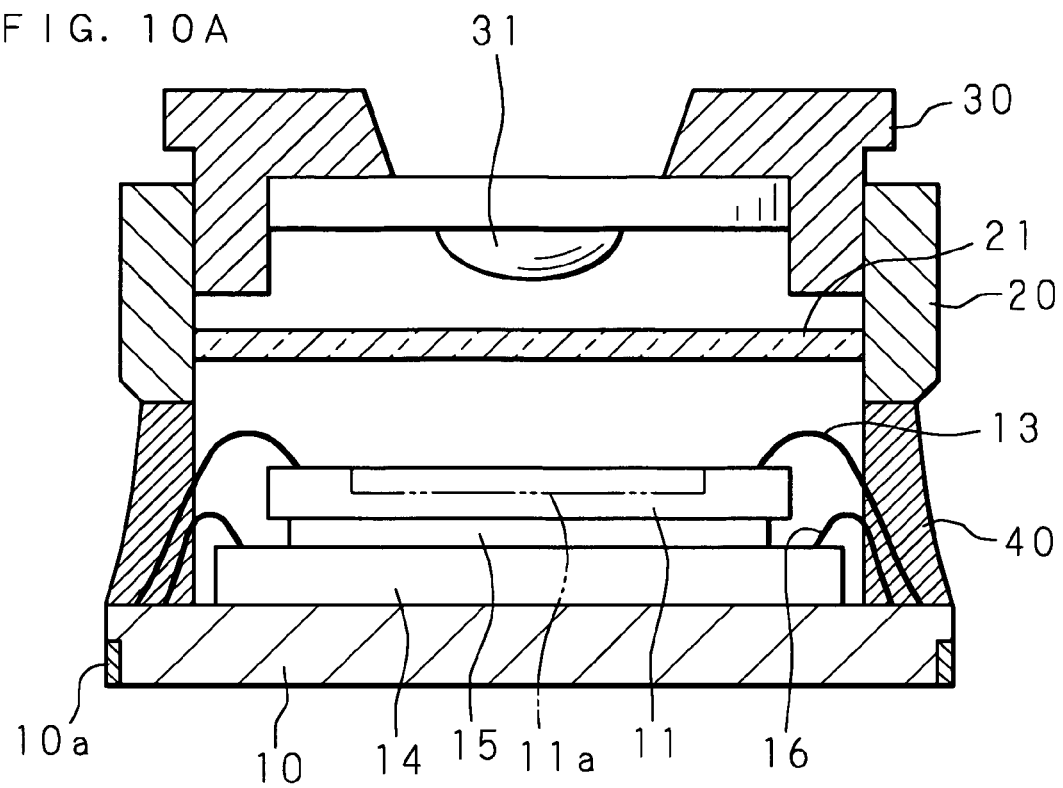
FIGS. 10A and 10B are sectional side views showing other structure of a module for an optical device according to the present invention.

Note that although each of the embodiments explains an embodiment where the solid state image pickup element 11 is placed on the substrate 20 as a wiring board, the present invention is not limited to this. For example, as shown in FIGS. 10A and 10B, in a structure where a DSP 14 as an image processing device is placed on a substrate 10, a spacer 15 made of a silicon strip is bonded onto the DSP 14 and an image pickup element 11 is bonded onto the spacer 15, if the image pickup element 11 and the substrate 10 are connected with a bonding wire 13 and the DSP 14 and the substrate 10 are connected with a bonding wire 16, a part (or all) of the bonding wire 13 and bonding wire 16 may be covered with a cover 40 (FIG. 10A).

Figure 10B:
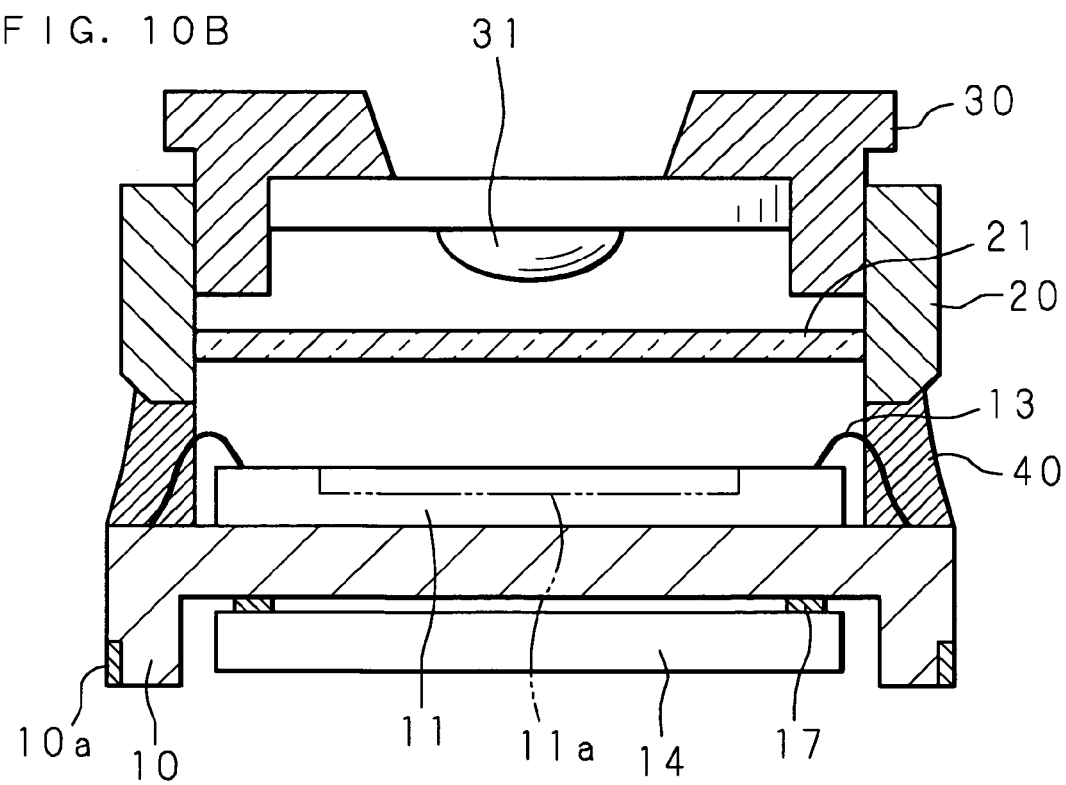

Moreover, in a structure where an image pickup element 11 is placed on one surface (upper surface) of a substrate 10 and a DSP 14 as an image processing device is placed on the other surface (lower surface) through a gold bump 17, if the image pickup element 11 and the substrate 10 are connected with a bonding wire 13, a part (or all) of the bonding wire 13 may be covered with a cover 40 (FIG. 10B). Of course, it may be possible to use a structure where a semiconductor chip other than the DSP 14 and the image pickup element 11 are piled one upon the other, or it may be possible to use a structure where a greater number of semiconductor chips are piled up.

Figure 11:
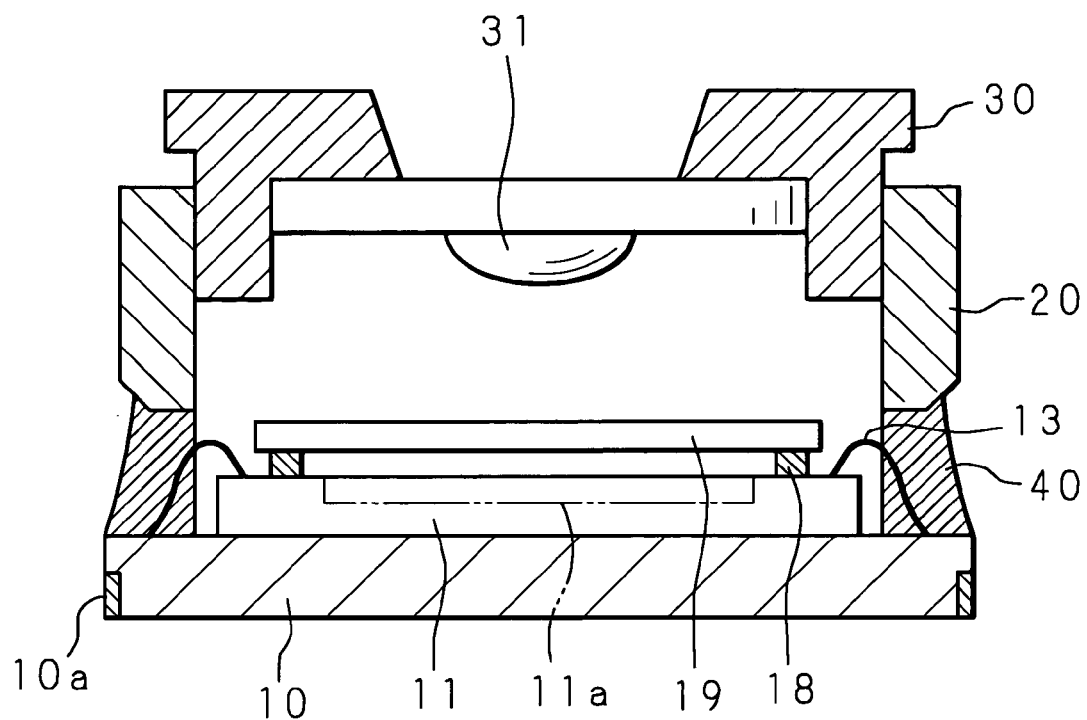
FIG. 11 is a sectional side view showing other structure of a module for an optical device according to the present invention.

Further, as shown in FIG. 11, even in an embodiment in which a light-transmitting lid 19 made of a light-transmitting material such as a glass is bonded onto the light receiving section 11a side of the image pickup element 11 through an adhesive section 18 and the image pickup element 11 is placed on the substrate 10, similarly, a part (or all) of the bonding wire 13 connecting the image pickup element 11 and the substrate 10 is covered with the cover 40. In this case, if an infrared cut film is formed on the surface of the light-transmitting lid 19 to also function as an IR cut filter, there is no need to provide the holder 20 with an IR cut filter 21. The infrared cut film is composed, for example, of a dielectric multi-layer film produced by alternately stacking high refractive layers made of titanium oxide, zirconium oxide, zinc sulfide, etc. and low refractive layers made of magnesium fluoride, calcium fluoride, silicon dioxide, etc., and can selectively cut infrared light by using interference of light. Of course, the filter is not limited to the IR cut filter, and a wavelength selecting filter that selects a wavelength to pass may be appropriately provided according to the use.

In short, the point of the present invention is to reduce the size of a module by providing a cover for covering a part or all of a bonding wire and placing an optical path demarcating device (lid) over the cover. The present invention has been explained by showing specific embodiments of a module for an optical device as one embodiment of a semiconductor device module and a manufacturing method thereof, but the present invention is not limited to these embodiments. The present invention is applicable to semiconductor device modules comprising a lid placed to face a semiconductor element, for example, memory modules such as an EPROM (Erasable Programmable Read Only Memory).

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A semiconductor device module comprising:
  a substrate on which a conductor wiring is formed;
  a semiconductor element connected to the conductor wiring with an electrically conductive wire;
  a lid placed to surround said semiconductor element and face said semiconductor element; and
  a cover for covering a part or all of the electrically conductive wire,
  wherein said lid is placed over said cover.

2. The semiconductor device module according to claim 1, wherein said semiconductor element is sealed with said substrate, said lid and said cover.

3. The semiconductor device module according to claim 1, wherein said substrate has
   a bonding pad for connecting the electrically conductive wire, and
   a bonding section for bonding said lid at a position where the bonding pad is not provided.

4. The semiconductor device module according to claim 3, wherein said substrate has a rectangular shape, and
   the bonding pads are placed on one to three sides of said substrate.

5. The semiconductor device module according to claim 3, wherein said substrate has a greater thickness in the bonding section than in other section, and
   said lid is bonded to said substrate in an area where said substrate has the greater thickness.

6. The semiconductor device module according to claim 3, wherein said substrate is in the form of a flat plate, and
   said lid has a leg part in an area corresponding to the bonding section and is bonded to said substrate by the leg part.

7. The semiconductor device module according to claim 1, wherein said cover is made of a non-electrically conductive resin.

8. The semiconductor device module according to claim 1, wherein said semiconductor element is an image pickup element having an image pickup surface on one surface, and
   said lid has an optical member and a holder body for holding the optical member, and demarcates an optical path to the image pickup surface.

9. A manufacturing method of a semiconductor device module comprising a substrate on which a conductor wiring is formed, a semiconductor element connected to the conductor wiring with an electrically conductive wire, and a lid having a leg part placed to face said semiconductor element, comprising:
   a step of placing said semiconductor element on said substrate and connecting said semiconductor element and said substrate with the electrically conductive wire;
   a bonding step of placing the leg part of the lid on said substrate and bonding the leg of the lid to said substrate, so as to bond the lid to said substrate; and
   a sealing step of sealing a gap between said substrate and said lid by covering a part or all of the electrically conductive wire with a cover, after said bonding step.

10. The manufacturing method of a semiconductor device module according to claim 9, wherein, in the sealing step, said cover is formed by injecting a non-electrically conductive resin into the gap.

11. The manufacturing method of a semiconductor device module according to claim 10, wherein the non-electrically conductive resin has a heat-curing property or a photo-curing property.

12. A manufacturing method of a semiconductor device module comprising a substrate on which a conductor wiring is formed, a semiconductor element connected to the conductor wiring with an electrically conductive wire, and a lid placed to face said semiconductor element, comprising:
   a step of placing said semiconductor element on said substrate and connecting said semiconductor element and said substrate with the electrically conductive wire;
   a covering step of covering a part or all of the electrically conductive wire with a cover; and
   a fixing step of fixing a position of said lid with respect to said substrate by placing said lid on said cover, after the covering step.

13. The manufacturing method of a semiconductor device module according to claim 12, wherein, in the covering step, said cover is formed by applying a non-electrically conductive resin with a curing property and curing the non-electrically conductive resin.

14. The manufacturing method of a semiconductor device module according to claim 13, wherein the non-electrically conductive resin has a heat-curing property or a photo-curing property.

15. The manufacturing method of a semiconductor device module according to claim 13, wherein the non-electrically conductive resin has a heat-curing property or a photo-curing property, and
   in the fixing step, said lid is placed before the non-electrically conductive resin cures.

* * * * *